(12) United States Patent
Luxford et al.

(10) Patent No.: US 10,976,788 B2
(45) Date of Patent: Apr. 13, 2021

(54) METHOD OF COOLING COMPUTER EQUIPMENT

(71) Applicant: Cooltera Limited, Horsham (GB)

(72) Inventors: Mark Steven Luxford, Gillingham (GB); Adrian Coles, Horsham (GB)

(73) Assignee: COOLTERA LIMITED, Horsham (GB)

( * ) Notice: Subject to any disclaimer, the term of this patent is extended or adjusted under 35 U.S.C. 154(b) by 186 days.

(21) Appl. No.: 16/146,820

(22) Filed: Sep. 28, 2018

(65) Prior Publication Data

US 2019/0101964 A1 Apr. 4, 2019

(30) Foreign Application Priority Data

Sep. 29, 2017 (GB) ..................................... 1715916

(51) Int. Cl.
*G06F 1/20* (2006.01)
*H05K 7/20* (2006.01)

(52) U.S. Cl.
CPC ........... *G06F 1/206* (2013.01); *H05K 7/2039* (2013.01); *H05K 7/2079* (2013.01); *H05K 7/20272* (2013.01); *H05K 7/20281* (2013.01); *H05K 7/20781* (2013.01); *H05K 7/20836* (2013.01); *G06F 2200/201* (2013.01)

(58) Field of Classification Search
CPC .... G06F 11/3058; G06F 9/4893; G06F 1/206; H05K 7/20281
USPC .................................. 165/244, 80.4; 361/699
See application file for complete search history.

(56) References Cited

U.S. PATENT DOCUMENTS

| 9,392,727 | B2 * | 7/2016 | Chester | H05K 7/20772 |
|---|---|---|---|---|
| 9,420,729 | B2 * | 8/2016 | Kelley | H05K 7/20736 |
| 2009/0167228 | A1 * | 7/2009 | Chung | H05K 7/20209 318/455 |
| 2009/0206167 | A1 * | 8/2009 | Deng | G06F 11/30 236/94 |
| 2009/0234705 | A1 * | 9/2009 | Brunschwiler | G06Q 10/06 62/259.2 |
| 2010/0302678 | A1 * | 12/2010 | Merrow | G11B 33/1426 360/97.13 |
| 2011/0132579 | A1 * | 6/2011 | Best | H05K 7/20381 165/104.31 |

(Continued)

*Primary Examiner* — Paul Alvare
(74) *Attorney, Agent, or Firm* — The Small Patent Law Group, LL; Jason P. Gross

(57) ABSTRACT

Method of cooling computer equipment that includes pumping coolant into a passageway leading to computer equipment and distributing the coolant from the passageway to heat sinks. The method also includes iteratively adjusting a rate of cooling of electronic devices by the coolant directly or indirectly in dependence upon heat generated by the electronic devices. The method also includes monitoring the respective temperatures of the electronic devices or heat conductive material in thermal contact therewith. The method also includes iteratively calculating the average of the values that said temperatures have at a given time. The method also includes iteratively calculating a spread value indicative of the spread of said values and iteratively adjusting the rate of cooling of the electronic devices by the coolant in dependence upon the ratio of said spread value and a difference between said average and a predetermined maximum acceptable temperature.

11 Claims, 4 Drawing Sheets

(56) References Cited

U.S. PATENT DOCUMENTS

| | | | |
|---|---|---|---|
| 2013/0073096 A1* | 3/2013 | Brey | G05B 13/02 700/282 |
| 2013/0248140 A1* | 9/2013 | Haigh | G06F 1/206 165/11.1 |
| 2014/0202678 A1* | 7/2014 | Goth | F28F 27/02 165/287 |
| 2014/0365793 A1* | 12/2014 | Cox | G06F 1/206 713/320 |
| 2016/0295750 A1* | 10/2016 | Zhang | H05K 7/20818 |
| 2018/0088610 A1* | 3/2018 | Lee | G05D 23/1917 |
| 2020/0118012 A1* | 4/2020 | Boaz Costa Leite | G06F 1/206 |

\* cited by examiner

METHOD OF COOLING COMPUTER EQUIPMENT

CROSS-REFERENCE TO RELATED APPLICATIONS

The present application claims the benefit of Patent Application No. GB 1715916.1 from the United Kingdom, which was filed on Sep. 29, 2017 and is incorporated herein by reference in its entirety.

BACKGROUND

Embodiments relate to a method of cooling computer equipment, which equipment comprises a multiplicity of electronic devices with respective heat sinks, the method comprising:
pumping coolant into a passageway leading to the computer equipment;
distributing the coolant from the said passageway to the heat sinks;
iteratively adjusting the rate of cooling of the electronic devices by the coolant which is pumped into the said passageway directly or indirectly in dependence upon the heat generated by the electronic devices.

In previously proposed such methods the rate of flow of the coolant is adjusted in dependence upon the overall difference (Δt) between the temperature of the coolant at the inlet and the temperature of the coolant at the outlet of the computer equipment. However, this does not account for differences in the kind of demand placed on the computer equipment, more especially the individual electronic devices. As a result, the operating temperature of the electronic devices may be maintained at a temperature well below what is a safe temperature, with consequential unnecessary wastage of thermal energy.

SUMMARY

In an embodiment, a method of cooling computer equipment is provided. The equipment include a multiplicity of electronic devices with respective heat sinks. The method includes pumping coolant into a passageway leading to the computer equipment, distributing the coolant from the said passageway to the heat sinks, and iteratively adjusting the rate of cooling of the electronic devices by the coolant which is pumped into the said passageway directly or indirectly in dependence upon the heat generated by the electronic devices. The method also includes monitoring the respective temperatures of the electronic devices or heat conductive material in thermal contact therewith and iteratively adjusting the rate of cooling of the electronic devices by the coolant which is pumped into the said passageway directly or indirectly in dependence upon the said respective temperatures.

In some aspects, the said rate of cooling is effected by increasing the rate of flow of coolant through the computer equipment.

In some aspects, the said rate of cooling is effected by reducing the temperature of the coolant before it reaches the computer equipment.

Optionally, the said rate of cooling is effected by increasing the flow rate of coolant flowing through a primary circuit of a heat exchanger of the equipment.

Also optionally, the said rate of cooling is effected by reducing the temperature of coolant flowing through a primary circuit of a heat exchanger of the equipment.

In some aspects, the method also includes iteratively calculating the average of those temperatures and iteratively adjusting the rate of cooling of the electronic devices by the coolant which is pumped into the said passageway directly or indirectly in dependence upon the said average of those temperatures.

Optionally, the method also includes iteratively calculating a difference value indicative of the difference between the said average of those temperatures and a desired or ideal value of those temperatures. The method also includes iteratively adjusting the rate of cooling of the electronic devices by the coolant which is pumped into the said passageway directly or indirectly in dependence upon the said difference value.

Also optionally, the method may include iteratively calculating a spread value indicative of the spread of those temperatures and iteratively adjusting the rate of cooling of the electronic devices by the coolant which is pumped into the said passageway directly or indirectly in dependence upon the said spread value and the said average of those temperatures. In some cases, the rate of cooling of the electronic devices by the coolant which is pumped into the said passageway may be iteratively adjusted in dependence upon the ratio of the said spread value and the difference between the said average and a predetermined maximum acceptable temperature of the electronic devices or heat conductive material in thermal contact therewith. Optionally, the rate at which coolant is pumped into the said passageway is iteratively adjusted to maintain a predetermined ratio of the said spread value and the difference between the said average and a predetermined maximum acceptable temperature of the electronic devices or heat conductive material in thermal contact therewith.

Optionally, the said spread value is the standard deviation σ of the said temperatures, given by the equation:

$$\sigma = \sqrt{\frac{\sum_{i=1}^{i=N}(t_i - \bar{t})^2}{N-1}}$$

in which N is the number of electronic devices, $t_i$ is the temperature of the $i^{th}$ electronic device, or the heat conductive material in thermal contact therewith, and $\bar{t}$ is the said average.

In some aspects, in the event that the said cooling rate would not be increased according to the dependence of that rate on the said temperatures, and that the highest of the said temperatures exceeds a maximum allowable temperature, the said cooling rate is increased nonetheless. Optionally, in such an event, an alarm or warning is issued to the user to investigate the electronic device or devices which is or are too hot.

In an embodiment, a cooling apparatus for carrying out a method as describe herein is provided. Optionally, the cooling apparatus may include a pump which pumps coolant towards computer equipment when the apparatus is in use to cool a multiplicity of electronic devices of the computer equipment. The cooling apparatus also includes a pump controller of the pump which serves to adjust the rate at which the pump pumps coolant towards the computer equipment when the apparatus is in use. The cooling apparatus also includes an electronic input device capable of receiving and distinguishing between a multiplicity of input signals, respectively, indicative of the temperatures of respective electronic devices of such equipment or heat conductive material in thermal contact therewith. The cooling apparatus also includes a processing unit connected to the input device and programmed to calculate the average of those temperatures and also a spread value indicative of the spread thereof. The processing unit is also connected to the pump controller so as to adjust the said pumping rate in dependence upon the said average and the said spread value.

BRIEF DESCRIPTION OF THE DRAWINGS

Examples of cooling methods and cooling apparatus in accordance with one or more embodiments will now be described in greater detail with reference to the accompanying drawings, in which.

DETAILED DESCRIPTION OF EMBODIMENTS

Figure 1:
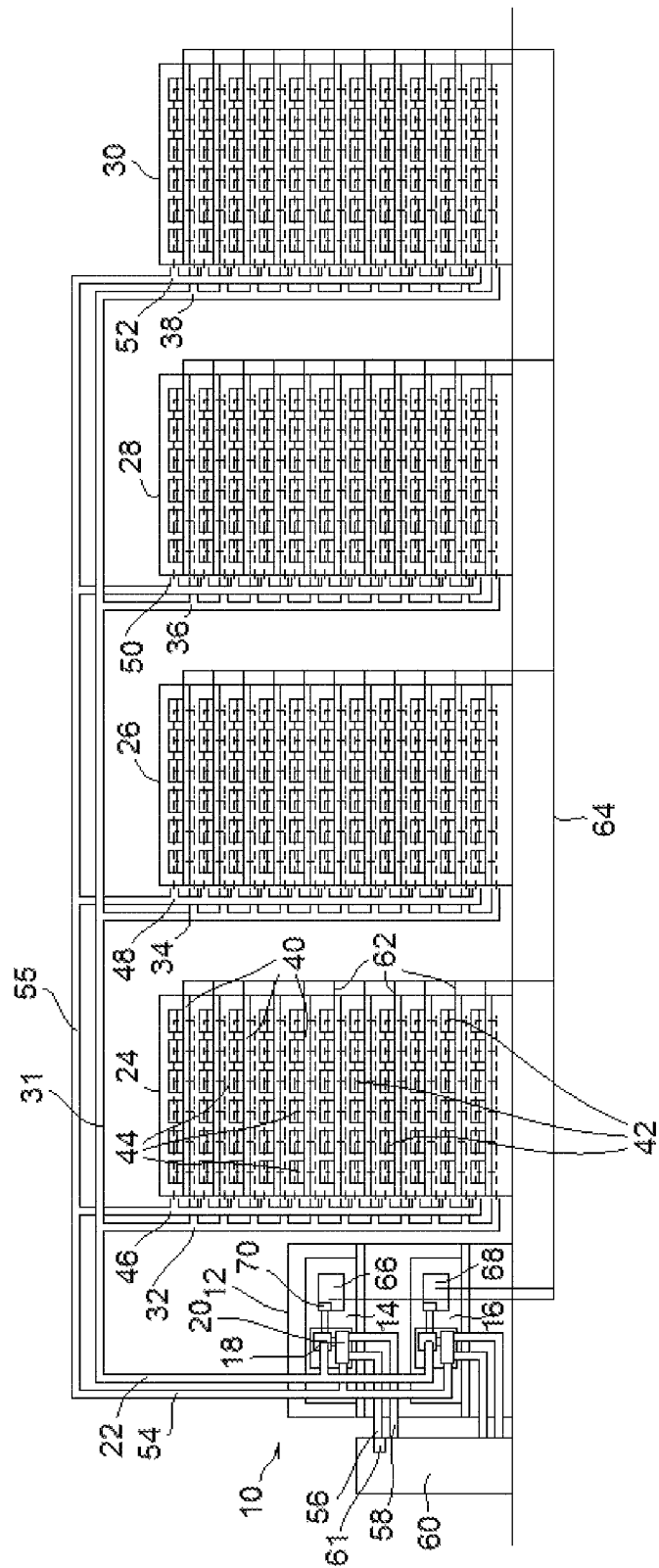
FIG. 1 is a diagrammatic elevational view of apparatus connected to a plurality of servers of computer equipment, to operate a method in accordance with one or more embodiments.

Accordingly, one or more embodiments are directed to a method of cooling computer equipment as set out in the opening paragraph of the present specification, in which the method further comprises:

monitoring the respective temperatures of the electronic devices or heat conductive material in thermal contact therewith;

iteratively adjusting the rate of cooling of the electronic devices by the coolant which is pumped into the said passageway directly or indirectly in dependence upon the said respective temperatures.

This enables the coolant pumped into the passageway to have a higher temperature than if the pumping rate is dependent merely on the said Δt, whilst still maintaining the temperatures of the electronic devices at a safe level. Thus, if some of the electronic devices are at a state of "idle" and some are being driven at a high work rate, this can not be detected merely by monitoring the value of the said (Δt) as the coolant fluid from the individual heat sinks will mix to give a false indication of the cooling needs of the busy devices. This leads to a risk of under-cooling of the busy devices leading to potential shutdown or failure.

The resultant saving in energy may be used for example to enable a greater amount of data to be handled by the computer equipment with a given overall power availability, and to safely maximize the return coolant temperature such that it would be more valuable for heat recovery, to heat an adjacent space for example.

The said rate of cooling may be effected either by increasing the rate of flow of coolant through the computer equipment, or by reducing the temperature of the coolant before it reaches the computer equipment, for example in a heat exchanger by increasing the flow rate or reducing the temperature of coolant flowing through a primary circuit of the heat exchanger.

Advantageously, the method further comprises iteratively calculating the average of those temperatures, and iteratively adjusting the rate of cooling of the electronic devices by the coolant which is pumped into the said passageway directly or indirectly in dependence upon the said average of those temperatures.

This enables an improvement on the saving in energy whilst maintaining safe operation of the computer equipment.

Advantageously the method further comprises iteratively calculating a difference value indicative of the difference between the said average of those temperatures and a desired or ideal value of those temperatures, and iteratively adjusting the rate of cooling of the electronic devices by the coolant which is pumped into the said passageway directly or indirectly in dependence upon the said difference value.

This may further improve the potential saving in energy in a safe manner.

Alternatively the method further comprises iteratively calculating a spread value indicative of the spread of those temperatures, and iteratively adjusting the rate of cooling of the electronic devices by the coolant which is pumped into the said passageway directly or indirectly in dependence upon the said spread value and the said average of those temperatures.

This may further improve the potential saving in energy in a safe manner.

Advantageously, the rate of cooling of the electronic devices by the coolant which is pumped into the said passageway is iteratively adjusted in dependence upon the ratio of the said spread value and the difference between the said average and a predetermined maximum acceptable temperature of the electronic devices or heat conductive material in thermal contact therewith.

This may further improve the potential saving in energy in a safe manner.

Advantageously, the rate at which coolant is pumped into the said passageway is iteratively adjusted to maintain a predetermined ratio of the said value and the difference between the said average and a predetermined maximum acceptable temperature of the electronic devices or heat conductive material in thermal contact therewith.

This may further improve the potential saving in energy in a safe manner.

The said spread value may be the standard deviation σ of the said temperatures, given by the equation:

$$\sigma = \sqrt{\frac{\sum_{i=1}^{i=N}(t_i - \bar{t})^2}{N-1}}$$

in which N is the number of electronic devices, $t_i$ is the temperature of the $i^{th}$ electronic device, or the heat conductive material in thermal contact therewith, and $\bar{t}$ is the said average.

This may improve the potential saving in energy further in a safe manner.

In one example of a method in accordance with one or more embodiments, in the event that the said cooling rate would not be increased according to the dependence of that rate on the said temperatures, and that the highest of the said temperatures exceeds a maximum allowable temperature, the said cooling rate is increased nonetheless. At the same time, an alarm or warning may be issued to the user to investigate the electronic device or devices which is or are too hot, in case there is some problem that can be rectified so the system can be returned to efficient operation after the electronic device or devices has or have been fixed or replaced.

One or more embodiments include a cooling apparatus for carrying out the method as described herein.

One or more embodiments may comprise cooling apparatus having a pump which pumps coolant towards computer equipment when the apparatus is in use to cool a multiplicity of electronic devices of the computer equipment, a pump controller of the pump which serves to adjust the rate at which the pump pumps coolant towards the computer equipment when the apparatus is in use, an electronic input device capable of receiving and distinguishing between a multiplicity of input signals respectively indicative of the temperatures of respective electronic devices of such equipment or heat conductive material in thermal contact therewith, a processing unit connected to the input and programmed to calculate the average of those temperatures and also a spread value indicative of the spread thereof, the processing unit also being connected to the pump controller so as to adjust the said pumping rate in dependence upon the said average and the said spread value.

The apparatus 10 shown in FIG. 1 comprises a housing 12 within which are mounted two coolant distribution units (CDUs) 14 and 16. The presence of two such units provides a redundancy such that should one of the CDUs fail, the other is able to take over.

Each CDU 14 and 16 is provided with a pump 18 and a heat exchanger 20. An output from the pump 18 is connected to feed coolant from the pump 18 into a fluid passageway or feed line in the form of a hose or pipe 22 towards computer equipment comprising a plurality of servers 24, 26, 28 and 30. The hose or pipe 22 is connected to respective built-in coolant input manifolds 32, 34, 36 and 38 of the servers 24, 26, 28 and 30 via an overhead pipe 31.

Each server 24, 26, 28 and 30 comprises a stack of printed circuit boards 40 each bearing a multiplicity of electronic components with respective heat sinks 42 surrounded by respective casings or jackets 44 each and every one of which is connected to receive fluid from the associated input manifold 32, 34, 36 or 38. Each casing or jacket 44 is made of a thermally conductive material and is in thermal contact with its associated heat sink 42.

The servers 24, 26, 28 and 30 are also provided with built-in coolant output manifolds 46, 48, 50 and 52 each of which is connected to receive coolant from each and every casing 44 of its associated server 24, 26, 28 or 30. All the output manifolds 46, 48, 50 and 52 are connected to a fluid passageway or return line in the form of a hose or pipe 54 via an overhead pipe 55, which hose 54 in turn is connected to feed coolant to the input of the heat exchanger 20. An output from the heat exchanger 20 is connected to an input of the pump 18 to complete a closed coolant loop comprising the pump 18, the hose 22, the manifolds 32, 34, 36 and 38, the casings 44, the manifolds 46, 48, 50 and 52, the hose 54 and the heat exchanger 20, and constituting a secondary circuit of each CDU 14 or 16. The primary circuit, by which coolant in the secondary circuit is cooled at the heat exchanger 20, comprises feed and return lines 56 and 58 from and to the heat exchanger 20, which lines 56 and 58 are connected to an external radiator 60 at which the primary coolant is cooled and which includes a pump 61 to keep primary coolant flowing through the primary circuit.

Temperature sensor electrical conductors represented by lines 62 in FIG. 1 are constituted by bundles of electrical conductors, one conductor per electronic device 42 or casing or jacket 44, each and every conductor being connected directly or via a multiplexer (not shown) via an electrical conductor line 64 to respective central processing units (CPUs) 66 and 68 of the CDUs 14 and 16. In this way an electrical signal representative of the temperature of each and every electronic device or heat sink 42 or casing 44 is fed to the CPUs 66 and 68. Each CPU 66 and 68 is programmed to control a pump control 70 in electrical connection with the pump 18 of the CDU 14 or 16 to control the rate at which the pump 18 pumps coolant in the secondary circuit of the CDU 14 and 16 into the hose 22 and hence through the casings 44 of the heat sinks 42, in dependence upon the signals it receives from the line 64, and hence in dependence upon the temperatures of the heat sinks 42 or the casings 44.

Thus, when the apparatus 10 is in use and is connected to cool servers as shown in FIG. 1, coolant constituted by water is pumped by the pump 18 of the CDU 14 or 16 for the time being in operation, into the hose 22 towards the servers 24, 26, 28 and 30. Coolant from the hose 22 is fed through the pipe 31 to the manifolds 32, 34, 36 and 38 to all the casings 44 through which the coolant passes and thence to the manifolds 46, 48, 50 and 52, through the pipe 55 and then the hose 54, through the heat exchanger 20 where the water coolant is cooled by the primary circuit of the CDU as described earlier herein, and back to the pump 18. The speed of the latter, and hence the rate at which it pumps coolant towards the computer equipment constituted by the servers 24, 26, 28 and 30 is controlled by the pump control 70, which in turn is controlled by the CPU 66 or 68 in dependence upon the signals received by the CPU 66 or 68 from the line 64 and hence in dependence upon the temperatures of all the heat sinks 42 or casings 44.

Figure 2:
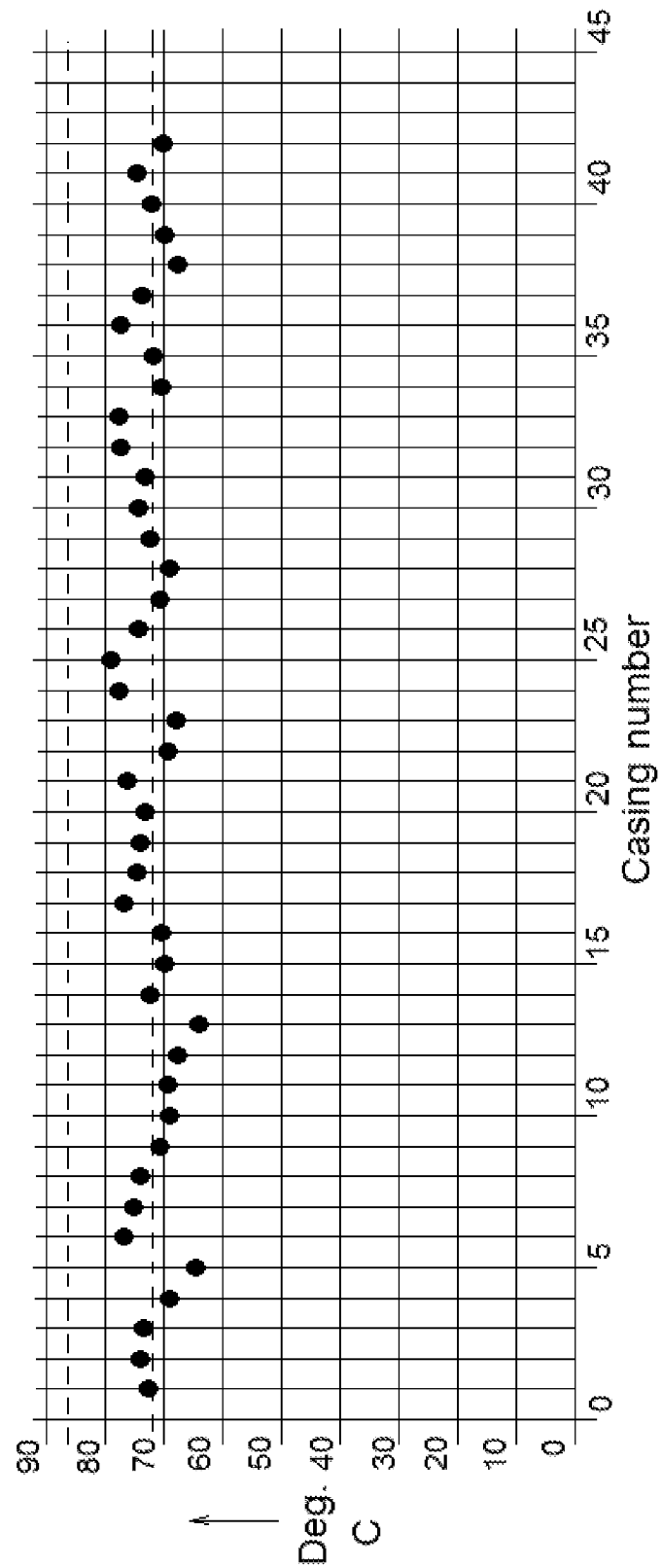
FIG. 2 is an explanatory graph.

An example of the variation in those temperatures is shown in FIG. 2. In that Figure, the casing number is shown along the horizontal axis of the graph. Temperature is indicated along the vertical axis, with the temperature in degrees centigrade indicated by the scale on the left of the Figure. The temperature of each casing is shown by a dot the level of which relative to the scale represents its temperature value. The lower of the horizontal broken lines shows the average temperature of all the casings, and the upper of those lines represents the maximum allowable temperature, beyond which there is an unacceptable risk of failure of the associated electronic device.

Figure 3:
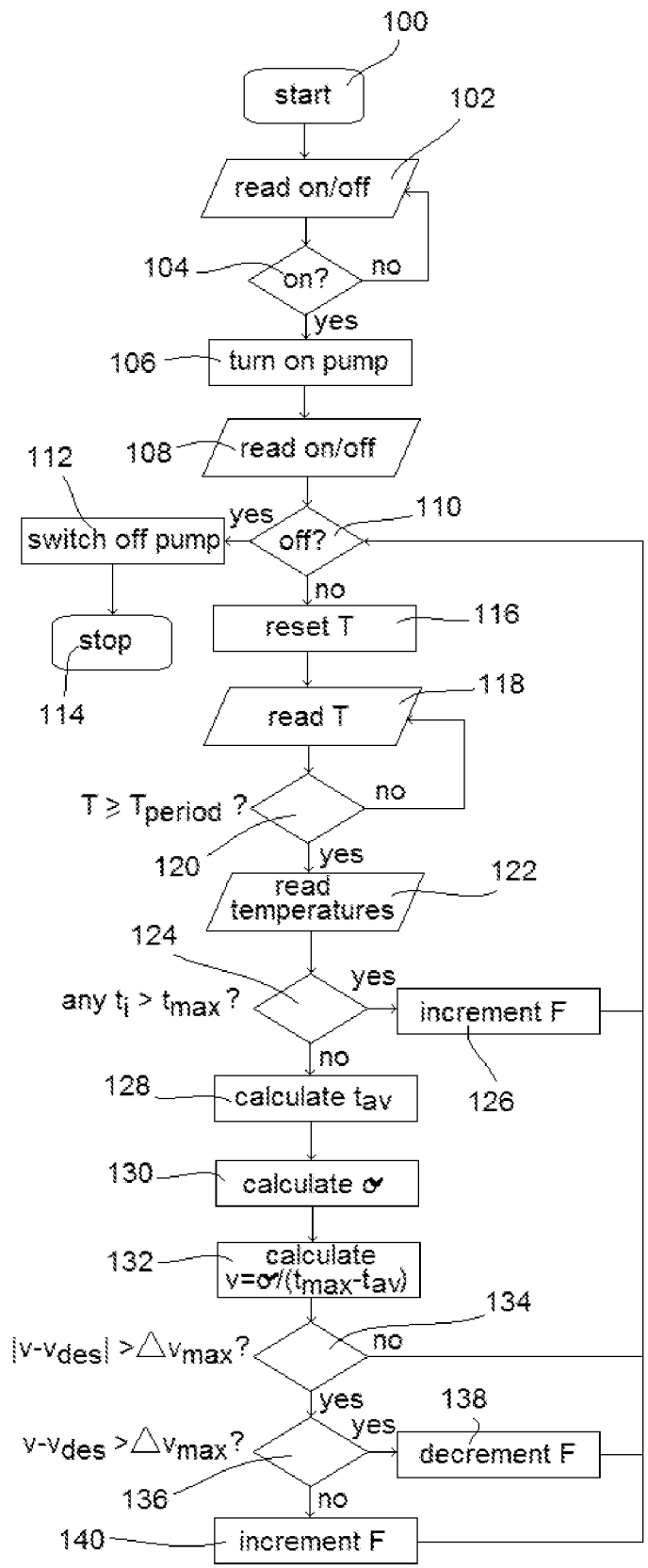
FIG. 3 shows a flow chart of the method of operation of the apparatus shown in FIG. 1.

That dependence of the pumping rate of the pump 18 on the temperatures indicated is determined by a computer program by which the CPU 66 or 68 is programmed to operate. A flow chart of that program is shown in FIG. 3. Thus, from the time the program commences to run at start 100, the position of a start/stop switch, which may be a soft switch, is read at step 102. At step 104, the program checks whether the switch is in the on position. If it is the program progresses to step 106, at which the pump is set running at a predetermined speed, initially to achieve a flow differential pressure set-point that delivers the known flow requirement of the system, to pump water coolant into the hose 22 at a rate F appropriate for the equipment which the CDU is to cool. If at step 104 the 10 start/stop switch is in the off position, the program returns to step 102. That completes the start-up procedure.

After step 106, the next step to be executed by the program is step 108, at which the CPU once again 15 reads the position of the on/off switch. At step 110 the program asks whether the on/off switch is in the off position. If it is in the off position, the program follows the path to step 112 at which the program causes the pump 18 to be switched off, after which the program shuts down and stops at step 114. That completes the shut-down procedure.

If at step 110 the on/off switch is still in the on position, the program progresses to step 116 at which a clock (not shown) in the CPU is set to zero and provides an indication of the time that has passed since it was last reset. At step 118 the time that has so elapsed is read from the clock. At the next step, step 120, the program checks whether the time read T at step 118 exceeds a predetermined period $T_{period}$, being the desired interval between successive iterations of the main loop in the program. Thus if $T<T_{period}$, the program reverts to step 118. If T is equal to or greater than $T_{period}$, the program progresses to its next loop at step 122. This completes the iteration control sub-program.

At step 122, the program has the CPU read the 10 multiplicity of temperatures indicated by the input from the line 64 shown in FIG. 1. It will therefore store in an access memory (not shown) of the CPU all these different values, which may be such as those indicated in FIG. 2.

From the values thus read, the program now executes step 124, at which it checks whether any temperature $t_i$ of any of the heat sinks or casings is greater than $t_{max}$, where $t_{max}$ is the maximum permissible temperature indicative of a temperature beyond which the associated electronic device would be at an unacceptable risk of malfunctioning. If the answer is yes, the program progresses to step 126, at which it causes the CPU to command the pump control 70 to increment the speed of the pump 18, to increase the flow rate of coolant through the pump by a predetermined amount ΔF. From step 128, the program returns to step 110. That completes an override loop to safeguard against any one of the electronic devices overheating.

If at step 126 none of the heat sinks or casings are at a temperature which exceeds $t_{max}$, the program progresses to step 128 at which it calculates the average value of all the heat sink or casing temperatures, $t_{average}$, and then to step 130, at which it calculates the standard deviation σ of those temperatures. It then calculates the value $v=\sigma/(t_{max}-t_{average})$ at step 132, and if the modulus of this value minus an desired value it should have ($|v-v_{des}|$) exceeds a predetermined amount $\Delta v_{max}$ at step 134 it progresses to step 136, otherwise it returns to step 110.

At step 136, the program checks whether the absolute value of v-vdes is greater than the 15 predetermined amount $\Delta v_{max}$. If it is, the program progresses to step 138, at which it causes the flow rate to be decremented by ΔF, to decrease the flow rate through the pump 18. If the absolute value of $v-v_{des}$ is less than the predetermined amount, it progresses to step 20 140, at which it causes the flow rate to be incremented by ΔF, to increase the flow rate through the pump 18. After whichever of the steps 138 or 140 is executed, the program returns to step 110.

Figure 4:
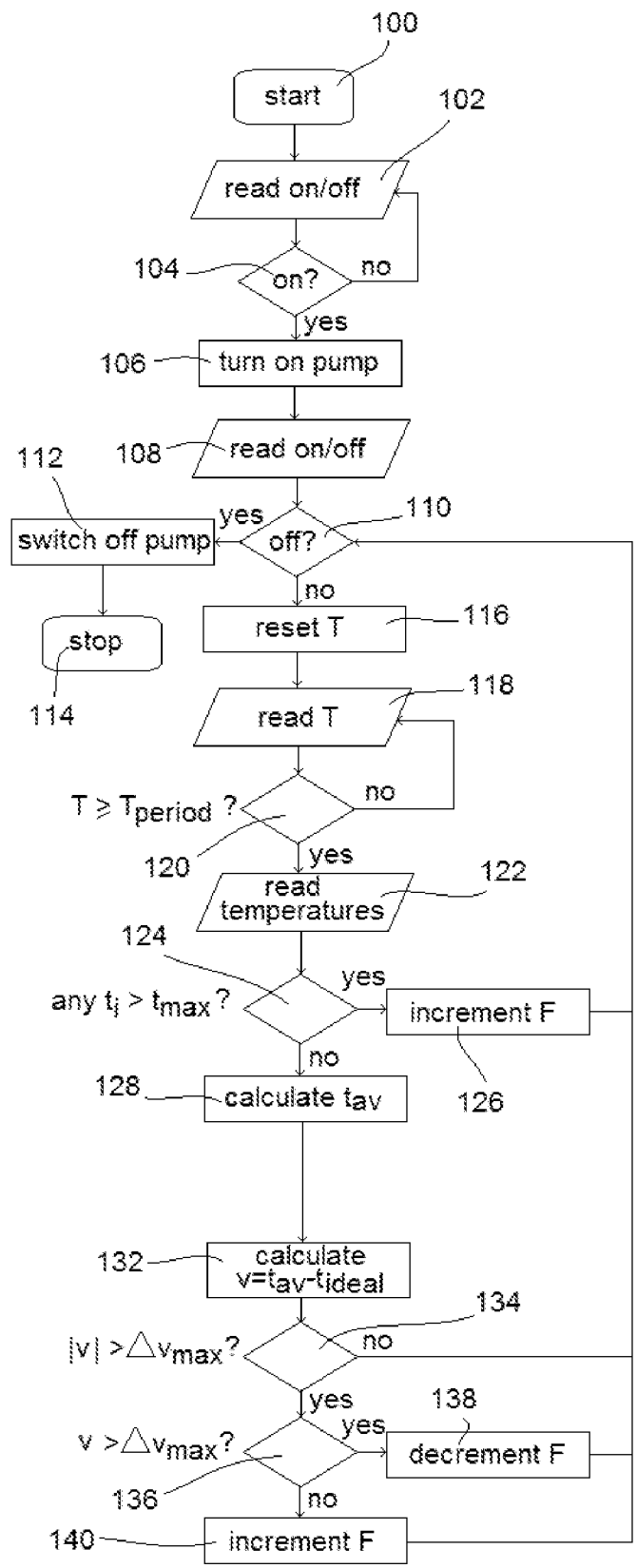
FIG. 4 shows a flow chart of an alternative method of operation of the apparatus shown in FIG. 1.

FIG. 4 shows a manner of operation of the apparatus shown in FIG. 1 that differs from the method shown in FIG. 3, in that the step 130 shown in FIG. 3 is removed, and at step 132, the value V is determined being the difference between an ideal value of the temperatures of the electronic devices or heat sinks 42, or the casings or jackets 44, and the calculated average value of those temperatures. At steps 134 and 136, it is the absolute value of the said difference, and the value of that difference respectively that is compared to $\Delta V_{max}$.

Many variations or modifications to the illustrated apparatus and the method by which it is operated may occur to the reader without taking the resulting construction or method outside the scope of the present invention. For example, instead of having the radiator and pump combination 60 and 61 shown in FIG. 1, the primary circuit might comprise a pump, expansion vessel and condenser as in refrigeration apparatus. Or instead there might be no primary circuit at all, and the coolant that is pumped to the servers 24, 26, 28 and 30 by the pump 18 may come from a reservoir of cool water, and simply allowed to drain away from the hose 54, with or without passing through a heat exchanger to extract 20 any useful thermal energy it has.

Many different measures of the spread of temperatures may be used other than the standard deviation, and may be simply the difference between the highest and lowest temperatures. Something other than the ratio of a value for the spread to the difference between the maximum and average temperatures may be used to control the flow rate through the pump 18, such as an electronically memorized look-up chart to provide an ideal flow rate for any given values of the average temperatures and the temperature spread.

Although the use of two CDUs provides a redundancy for the sake of safety, if one CDU is considered sufficiently reliable, one CDU could replace the two illustrated CDU's. Alternatively, for increased safety, more than two CDU's could be connected to give a greater level of redundancy.

The overhead pipe 31 could be located as an underfloor conduit or floor-level conduit or otherwise located.

The printed circuit boards 40 may instead be servers, GPU boxes or containment shells for the heat emitting electronic devices. The heat sinks of the electronic devices 42 may be in the form of solid copper, aluminium, or even silicone with tiny holes between processor layers.

The external radiator 60 could be a dry cooler, or a fluid cooler or a cooling tower or a chiller, for example, or it could be a heat exchanger cooled by river water or water to be drained.

The electrical signals representative of the temperature of each and every electronic device or heat sink 42 or casing or jacket 44 may be constituted by information in the form of a comma separated string of values (for example) via TCP/IP, RS485 and a given protocol, and the electrical conductor line 64 may be constituted by an ethernet cable.

What is claimed is:

1. A method of cooling computer equipment electronic devices with respective heat sinks, the method comprising:
    pumping coolant into a passageway leading to the computer equipment;
    distributing the coolant from said passageway to the heat sinks; and
    iteratively adjusting a rate of cooling of the electronic devices by the coolant which is pumped into said passageway directly or indirectly in dependence upon heat generated by the electronic devices, wherein the method further comprises:
    monitoring respective temperatures of the electronic devices or heat conductive material in thermal contact therewith;
    iteratively calculating an average of values that said temperatures have at a given time;
    iteratively calculating a spread value indicative of a spread of said values, the spread of said values representing how spread out said temperatures are at the given time; and
    iteratively adjusting the rate of cooling of the electronic devices by the coolant which is pumped into said passageway in dependence upon a ratio of said spread value and a difference between said average and a predetermined maximum acceptable temperature of the electronic devices or heat conductive material in thermal contact therewith.

2. The method of cooling computer equipment according to claim 1, wherein said rate of cooling is effected by increasing a flow rate of coolant through the computer equipment.

3. The method of cooling computer equipment according to claim 1, wherein said rate of cooling is effected by reducing the temperature of the coolant before it reaches the computer equipment.

4. The method of cooling computer equipment according to claim 3, wherein said rate of cooling is effected by increasing a flow rate of coolant flowing through a primary circuit of a heat exchanger of the equipment.

5. The method of cooling computer equipment according to claim 3, wherein said rate of cooling is effected by reducing the temperature of coolant flowing through a primary circuit of a heat exchanger of the equipment.

6. The method of cooling computer equipment according to claim 1, wherein the method further comprises iteratively calculating a difference value indicative of the difference between said average and a desired or ideal value of the temperatures of the electronic devices or heat conductive material in thermal contact therewith, and iteratively adjusting the rate of cooling of the electronic devices by the coolant which is pumped into said passageway directly or indirectly in dependence upon said difference value.

7. The method of cooling computer equipment according to claim 1, wherein the rate at which coolant is pumped into said passageway is iteratively adjusted to maintain a predetermined ratio of said spread value and the difference between the said average and a predetermined maximum acceptable temperature of the electronic devices or heat conductive material in thermal contact therewith.

8. The method of cooling computer equipment according to claim 1, wherein the said spread value is the standard deviation σ of said temperatures, given by the equation:

$$\sigma = \sqrt{\frac{\sum_{i=1}^{i=N}(t_i - \bar{t})^2}{N-1}}$$

in which N is the number of electronic devices, $t_i$ is the temperature of the $i^{th}$ electronic device, or the heat conductive material in thermal contact therewith, and $\bar{t}$ is said average.

9. The method of cooling computer equipment according to claim 1, wherein, the method includes increasing the rate of cooling, despite said dependence not requiring the rate of cooling to be increased, in response to determining that a highest of said temperatures exceeds a maximum allowable temperature.

10. The method of cooling computer equipment according to claim 9, wherein an alarm or warning is issued to the user to investigate the electronic device or devices that exceed the maximum allowable temperature.

11. A cooling apparatus having a pump which pumps coolant towards computer equipment to cool a multiplicity of electronic devices of the computer equipment, a pump controller of the pump which serves to adjust a rate at which the pump pumps coolant towards the computer equipment, an electronic multiplexer capable of receiving and distinguishing between a multiplicity of input signals respectively indicative of temperatures of respective electronic devices of such equipment or heat conductive material in thermal contact therewith at a given time, a processing unit connected to the multiplexer and programmed to calculate an average of values that said temperatures have at the given time and also a spread value indicative of the spread thereof, the spread of said values representing how spread out said temperatures are at the given time, the processing unit also being connected to the pump controller so as to adjust said rate in dependence upon a ratio of said spread value and the difference between said average and a predetermined maximum acceptable temperature of the electronic devices or heat conductive material in thermal contact therewith.

\* \* \* \* \*